United States Patent [19]
Namba et al.

[11] Patent Number: 5,910,699
[45] Date of Patent: Jun. 8, 1999

[54] METHOD OF MANUFACTURING A COMPOSITE SUBSTRATE AND A PIEZOELECTRIC DEVICE USING THE SUBSTRATE

[75] Inventors: Akihiko Namba; Tetsuyoshi Ogura; Yoshihiro Tomita, all of Osaka; Kazuo Eda, Nara, all of Japan

[73] Assignee: Matsushita Electric Industrial Co., Ltd., Japan

[21] Appl. No.: 08/876,287

[22] Filed: Jun. 16, 1997

Related U.S. Application Data

[62] Division of application No. 08/646,451, May 7, 1996, Pat. No. 5,698,471.

[30] Foreign Application Priority Data

May 8, 1995 [JP] Japan ..................................... 7-109648

[51] Int. Cl.$^6$ ................................................. H01L 41/08
[52] U.S. Cl. ........................... 310/320; 310/346; 310/348
[58] Field of Search ..................................... 310/320, 321, 310/346, 348

[56] References Cited

U.S. PATENT DOCUMENTS

| | | | |
|---|---|---|---|
| 5,201,977 | 4/1993 | Aoshima | 156/153 |
| 5,395,788 | 3/1995 | Abe et al. | 437/61 |
| 5,525,855 | 6/1996 | Gotoh et al. | 310/344 |
| 5,698,471 | 12/1997 | Namba et al. | 437/225 |

*Primary Examiner*—Thomas M. Dougherty
*Attorney, Agent, or Firm*—Parkhurst & Wendel, L.L.P.

[57] ABSTRACT

A method of manufacturing a composite substrate and the composite substrate manufactured thereby wherein surfaces of first and second substrates having different thermal expansion coefficients are mirror finished and layered on each other. A first heat treatment is applied after which a part of the second substrate is removed to a depth sufficient to expose the first substrate. A final second heat treatment directly bonds the substrates.

10 Claims, 8 Drawing Sheets

METHOD OF MANUFACTURING A COMPOSITE SUBSTRATE AND A PIEZOELECTRIC DEVICE USING THE SUBSTRATE

This is a Division of application Ser. No. 08/646,451 filed May 7, 1996 now U.S. Pat. No. 5,698,471.

BACKGROUND OF THE INVENTION

The present invention relates to a method of manufacturing a piezoelectric composite substrate structure. More particularly, the invention relates to joining, by wafer bonding, a piezoelectric material and another substrate. The present invention is further directed to a structure comprising a piezoelectric composite substrate.

Piezoelectric materials have been widely used as component materials for electronic devices used in communication equipment, data processing equipment, or other similar equipment. Various piezoelectric materials have also been used as component materials for communication devices. In particular, single crystal piezoelectric materials such as quartz, lithium niobate, lithium tantalate, or similar materials have been widely used for bulk wave devices such as piezoelectric transducers and elastic surface wave devices. In manufacturing these devices, wafer bonding technology and/or anodic bonding technology are employed to yield the desired compact size and yield.

With respect to wafer bonding technology, two substrates, either of the same or different material, are bonded without an intermediate adhesive layer such that adhesion by covalent bonding or ionic bonding between the atoms on the substrate surfaces occurs. Wafer bonding is accomplished by joining two mirror finished substrates and applying heat. anodic bonding is performed by joining two mirror finished substrates and heat treating them while, at the same time, applying a voltage to the interface between the two substrates. Bonding strength depends on the heat treatment temperature. Generally, the higher the heat treatment temperature, the stronger the bonding strength. However, when the treatment temperature becomes too high, adverse effects may occur. For example, if two substrates undergoing wafer bonding or anodic bonding have different thermal expansion rates, the substrates may break or delaminate due to the different thermal expansion coefficients.

Similar problems may occur with piezoelectric composite substrates or piezoelectric devices during manufacturing. For example, the average expansion coefficient of silicon from 25 to 300° C. is $3.4 \times 10^{-6}/°C.$, while that of quartz is $15.2 \times 10^{-6}/°C.$, lithium niobate is $18.3 \times 10^{-6}/°C.$, and lithium tantalate is $19.9 \times 10^{-6}/°C.$ In these piezoelectric materials, the average expansion coefficients are in the x-axis direction of the crystals. Thus, the thermal expansion coefficient of quartz in the x direction is five times that of silicon, and this difference in thermal expansion coefficients may cause damage to the substrate combination.

Japanese laid-open patent Heisei-5-327383 discusses the relationship between the thickness of a quartz substrate and temperature where the substrate is damaged when a quartz substrate and a semiconductor substrate are bonded by wafer bonding. That is, it is reported that the thinner the quartz substrate, the higher the damage temperature, because the stress generated at the bonding portion is reduced. For example, for a large silicon substrate, the damage temperature at which the substrate is damaged is 350° C. when the thickness of the quartz substrate is 80 μm, while the damage temperature at which the substrate is damaged is 450° C. when the thickness of the quartz substrate is 40 μm. The temperature at which damage occurs varies according to the size and configuration of the substrate. Accordingly, the heat treatment temperatures when wafer bonding have to be lower than the temperature at which damage may occur.

Furthermore, single heat treatments may have adverse effects. That is, in wafer bonding, water structuring molecules exist at the bonding interface after initial joining. Thus, there are water structuring molecules at the bonding interface during the adhering step. While, most of the water structuring molecules are removed as the heat treatment temperature rises, some are trapped by surrounding adhesion. As a result, voids are created without adhesion. Thus, there exist at the bonding interface strongly bonded portions and void portions resulting in uneven distribution of thermal stresses. This condition may damage the substrates and cause delamination of the joined substrates.

In the case of ionic bonding, voids may be generated due to gas existing at the bonding interface either from the initial joining or from gas being generated during the heat treatment, thus resulting in the same problems as discussed above. Moreover, while gas can be generated during the bonding processes of the substrates, further heat treatments after the bonding process may also generate additional gas. For example, thermal stress from heating from solder reflowing may generate voids, may damage the substrates, and may cause delamination of the substrates.

To solve these problems according to conventional methods, wafer bonding is accomplished by employing two heat treatments and using thin substrates. That is, substrates are bonded temporarily at a relatively low first temperature, thinned by a mechanical method or chemical etching, and then bonded strongly at a relatively high second temperature to complete wafer bonding. See, for example, Japanese laid-open patents. H5-327383, H4-286310, H-3-97215. More particularly, substrates are bonded temporarily by heat treating at the first temperature at which damage of the substrates does not occur, then thinned by grinding, and finally bonded strongly at a temperature sufficiently high to obtain the desired bonding strength.

However, even these methods cannot prevent the problems of the aforementioned voids and delamination. Moreover, yield tends to become lower in actual manufacturing processes. Since removing water from a central portion of the substrate is difficult compared to the periphery of the substrate, it is difficult to prevent damage caused by the stress generated at the central portion of the substrate. Central water deposits become an ever bigger problem when substrate size is enlarged in order to reduce manufacturing costs.

Even if the damage or delamination of substrates can be avoided, the stress to the substrates may affect the performance characteristics of elements formed on the composite substrate due to insufficient bonding. More specifically, such imperfections affect the temperature-to-frequency characteristics of a piezoelectric device such as a piezoelectric vibrator or a piezoelectric filter. That is, thermal stress experienced by substrates is increased by temperature changes.

Stress caused by different thermal expansion coefficients may also change the crystal structure. When molecule structures are the same but various crystal structures exist, the crystal structures may be changed by pressure or temperature. For example, when quartz is heated up to more than 573° C. under no pressure, the quartz transitions from α-quartz to β-quartz. Other phase transitions besides α-β phase transitions can also be seen. Dauphine twin type phase transitions which occur when stress is applied to quartz is one example. Moreover, a Dauphine twin type phase transition which occurs at high temperature is a nonreversible reaction as reported in *Annual Symposium Frequency Control*, Vol. 31, page 171 (1977). When an element is formed on a substrate on which these phase transitions have occurred, undesirable characteristics result. More specifically, in the case of a phase transition in AT cut quartz, dependency of frequency characteristics on temperature increases, thus stable operation of piezoelectric elements such as quartz vibrators and quartz filters cannot be realized.

SUMMARY OF THE INVENTION

When substrates having different thermal expansion coefficients are bonded by wafer bonding or anodic bonding, the substrates may experience damage or delamination when heated due to the different thermal expansion rates. Moreover, the crystal structure of the is substrates may be changed by thermal stress. Furthermore, a piezoelectric composite substrate may be distorted by subsequent stress.

Accordingly, it is an object of the present invention to solve the above problems. In particular, the invention overcomes the problems of substrate damage and delamination, crystal structure transition, performance characteristic degradation caused by subsequent stresses or surrounding temperature changes for piezoelectric composite substrates and piezoelectric devices composed of substrates having respective different thermal expansion rates.

To achieve the aforementioned objects, a method of manufacturing a composite substrate of the invention comprises the steps of mirror finishing at least one of the surfaces of a first substrate, mirror finishing at least one of the surfaces of a second substrate having a thermal expansion coefficient different from that of the first substrate, making the principal surface of the first substrate and the principal surface of the second substrate hydrophilic, abutting the principal surface of the first substrate and the principal surface of the second substrate on each other, applying a first heat treatment to the abutted substrates at a temperature lower than the temperature where bonding of the first substrate and the second substrate starts, in order to remove water remaining between the first substrate and the second substrate, dividing the joined substrates into at least two pieces while maintaining the joined state, and applying a second heat treatment to the at least two pieces at a temperature where bonding of the first substrate and the second substrate occurs.

Another method of manufacturing a composite substrate according to the present invention comprises the steps of mirror finishing at least one of the surfaces of a first substrate, mirror finishing at least one of the surfaces of a second substrate having a thermal expansion coefficient different from that of the first substrate, making the principal surface of the first substrate and the principal surface of the second substrate hydrophilic, abutting the principal surface of the first substrate on the principal surface of the second substrate, applying a first heat treatment to the abutted substrates at a temperature lower than the temperature where bonding of the first substrate and the second substrate starts, in order to remove water remaining between the first substrate and the second substrate, cutting a part of the second substrate to a depth sufficient to reach the first substrate after the first heat treatment step, and applying a second heat treatment to the joined substrates at a temperature where bonding of the first substrate and the second substrate occurs.

According to the present invention, even if substrates having respective different thermal expansion coefficients are joined by wafer bonding, the stress at the bonding portion can be remarkably reduced, and as a result, the problem of substrate damage and delamination can be prevented, and mass-production of the composite substrate can be enhanced. Moreover, since the stress in the substrates is effectively reduced, degradation of performance characteristics of an element formed on the substrates due to the stress can be avoided. Furthermore, with respect to a quartz substrate, phase transition stimulated by stress can be avoided.

BRIEF DESCRIPTION OF THE DRAWINGS

FIG. 5a is a perspective view and FIG. 5b is a plan view.

FIG. 6a is a perspective view and FIG. 6b is a plan view.

FIGS. 7a–b show structural views of a piezoelectric composite substrate in accordance with a tenth embodiment of the present invention, where FIG. 7a is a perspective view and FIG. 7b is a cross-sectional view.

FIG. 8a is a perspective view and FIG. 8b is a cross-sectional view.

DETAILED DESCRIPTION OF THE INVENTION

Embodiment 1

Figure 1A:
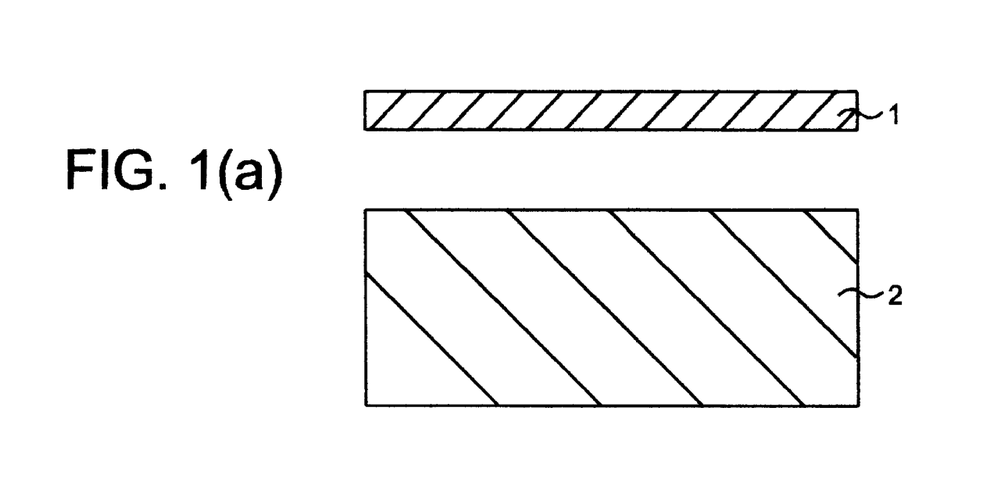
FIGS. 1a–c show a manufacturing method of a piezoelectric composite substrate in accordance with a first embodiment of the present invention.

A first embodiment of the manufacturing method of the present invention will be illustrated with reference to FIG. 1. FIG. 1(a) is a sectional view of a substrate 1 and a substrate 2. In this first embodiment substrate 1 is quartz and substrate 2 is silicon. Silicon substrate 2 is, for example, 12×12 mm in size and 450 $\mu$m thick, and quartz substrate 1 is, for example, 12×12 mm in size and 80 $\mu$m thick.

First, surfaces of quartz substrate 1 and silicon substrate 2 are mirror ground, and their respective surface layers are removed by a hydrofluoric acid system. Next, quartz substrate 1 and silicon substrate 2 are dipped in a mixed solution of ammonia, hydrogen peroxide, and deionized water to make the principal surfaces thereof hydrophilic. Thereafter, substrates 1, 2 are thoroughly washed by deionized water. As a result of the hydrophilic treatment, the surfaces of the substrates are terminated with hydroxyl groups. Next, the mirror ground surfaces of the two substrates 1, 2 are abutted, and the two are adhered to each other by Van der Waals force.

Next, a first heat treatment is applied at 150° C., for 5 hours to remove excess water remaining on or within the adhered substrates 1, 2. The first heat treatment is generally applied at a temperature in a range between 100–300° C., and is applied for several minutes up to tens of hours. Preferably the temperature range is between 100–200° C. and is applied for at least one hour. Under these conditions bonding of the substrates 1, 2 does not occur. While heating is necessary to remove excess water, ionic bonding or covalent bonding should be avoided, since stress would otherwise be experienced at the bonding interface 21 and this may cause damage to the substrates 1, 2. In other words, the first heat treatment temperature should be applied at a temperature at which the adhesive force by Van der Waals force is maintained, ionic bonding or covalent bonding does not occur, but water can nevertheless be removed. More specifically, the two substrates 1, 2 after the first heat treatment, should be separable from each other by mechanical means.

Next, a second heat treatment is applied at a temperature of 300° C. for 3 hours. This second heat treatment removes water at the bonding interface 21 and bonds the substrates 1, 2 along a bonding interface 22 by ionic bonds or covalent bonds. In the case of a quartz substrate 1 and a silicon substrate 2, the second heat treatment is performed at a temperature higher than the first heat treatment temperature and lower than the phase transition temperature of quartz, namely 573° C. This treatment should last for several minutes to tens of hours, and preferably at a temperature between 200–500° C.

Figure 1B:
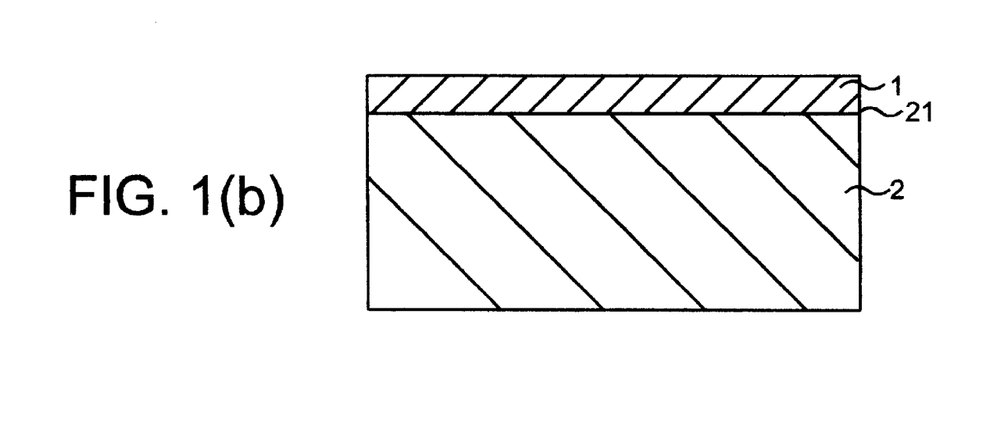

FIG. 1(b) shows a piezoelectric composite substrate after the first heat treatment. The two substrates 1, 2 are adhered at bonding interface 21 mainly by hydroxyl groups, or water structuring molecules. Here, the water structuring molecules are molecules based on water molecules on which various atoms or molecules existing at the interface are added.

Figure 1C:
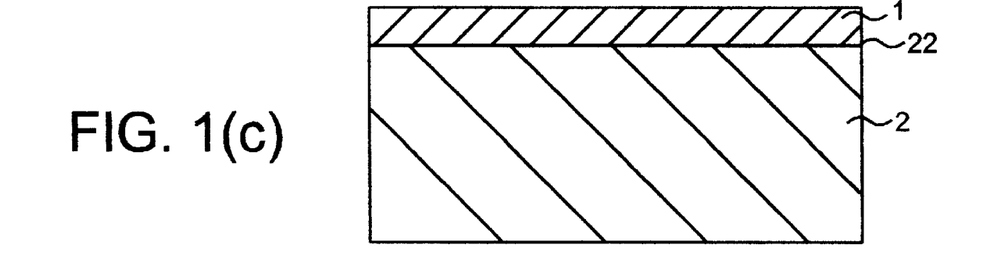
Figure 2A:
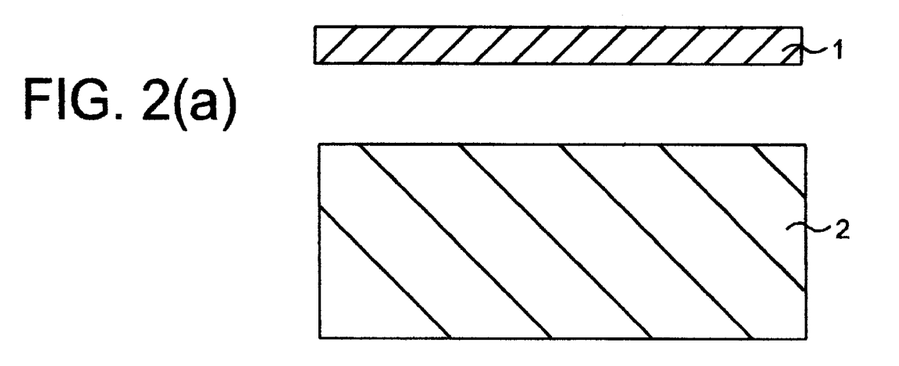
FIGS. 2a–d show a manufacturing method of a piezoelectric composite substrate in accordance with a second embodiment of the present invention.
Figure 2B:
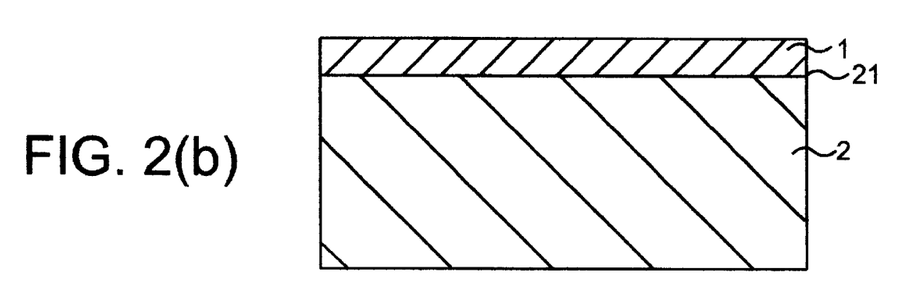
Figure 2C:
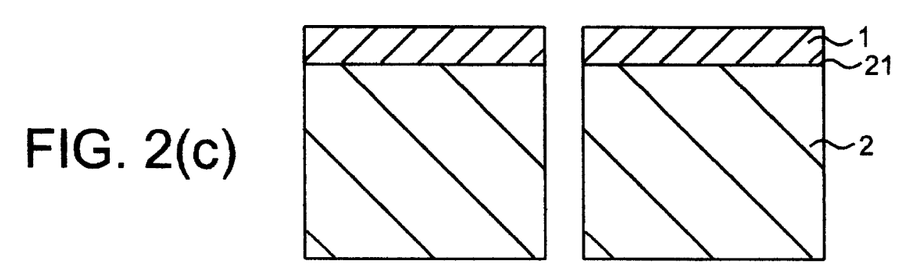
Figure 2D:
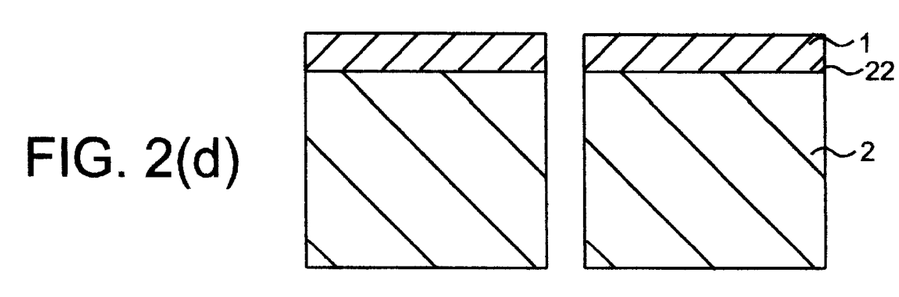
Figure 3A:
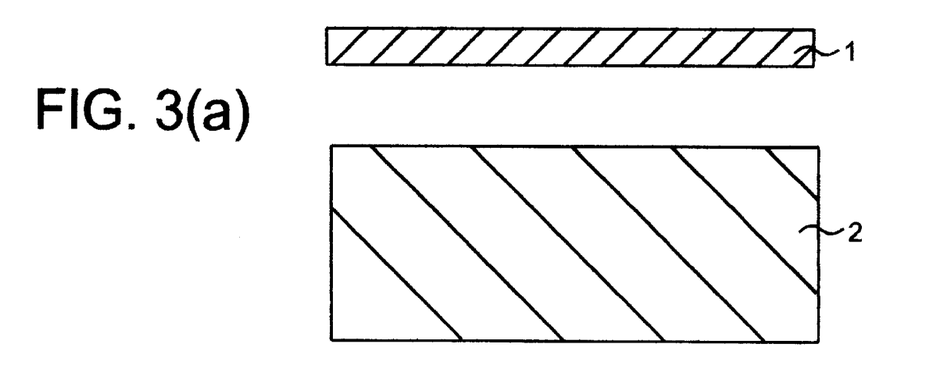
FIGS. 3a–d show a manufacturing method of a piezoelectric composite substrate in accordance with a third embodiment of the present invention.
Figure 3B:
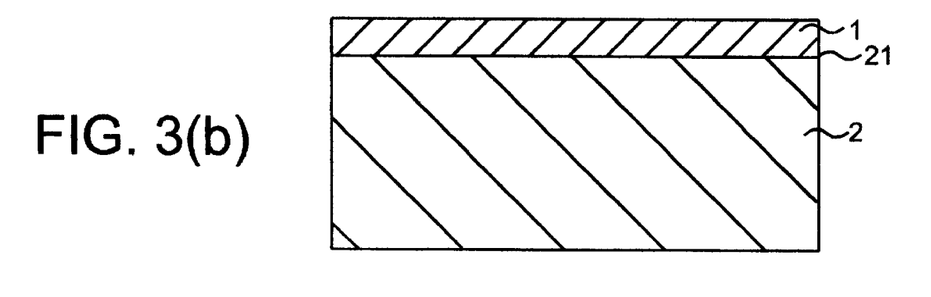
Figure 3C:
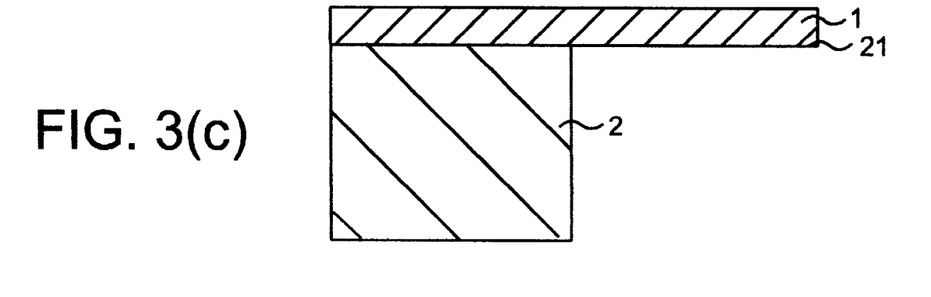
Figure 3D:
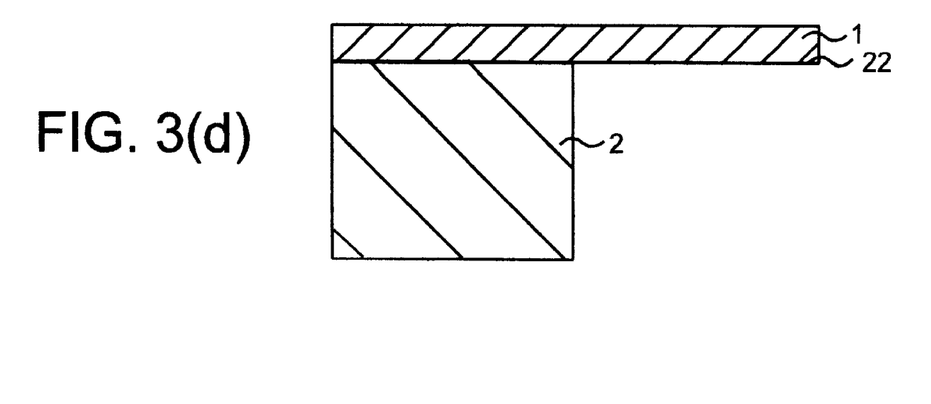

These bonds are relatively weak bonds, and water and gases at the bonding interface of the two substrates 1, 2 can be easily removed. Accordingly, few voids form at the bonding interface 21 of the substrates 1, 2. FIG. 1(c) shows a piezoelectric composite substrate after the second heat treatment. Here, the two substrates 1, 2 are strongly bonded at an atomic level at bonding interface 22 mainly by covalent bonds (siloxane bonds).

The manufacturing method illustrated above can suppress generation of voids, reduce stress, and realize wafer bonding using only heat treatments. That is, the step of thinning a substrate is avoided, thus, resulting in improved manufacturing yield of piezoelectric composite substrates.

By dividing the first heat treatment into a low temperature step and a high temperature step, removal of water and gas from the bonding interface 21 improves further. That is, water removal is more easily achieved not by rapid heating, but by step or slow heating. For example, a low temperature step of the first heat treatment is generally 100–200° C. for several minutes to tens of hours, and preferably 100–180° C. for one hour to tens of hours. The high temperature step is generally higher than the low temperature step and under 300° C. for several minutes to tens of hours, and preferably higher than the low temperature step and under 200° C. for one hour to tens of hours.

In the above embodiment, single crystal piezoelectric materials such as lithium tantalate or lithium niobate or other mirror grindable piezoelectric materials can be used as the piezoelectric substrate 1. Semiconductor substrates such as gallium arsenide, indium phosphate, glass, or other piezoelectric substrates having different thermal expansion coefficients from that of piezoelectric substrate 1 can be used as the substrate 2 to be bonded with the piezoelectric substrate 1.

When wafer bonding the same kind of piezoelectric substrates with each other, substrates having crystal anisotropy may be bonded with their crystal directions out of alignment, and the stress problems as with different types of substrates may occur. This problem is also solved by the present invention.

Embodiment 2

A second embodiment of the manufacturing method of the present invention will be illustrated referring to FIG. 2. As shown in FIG. 2a, the substrate materials 1, 2 and configurations are the same as in embodiment 1. Furthermore, the processes of embodiment 1 through the layering process are performed. Then, a first heat treatment is applied at a temperature of 250° C. for 5 hours. In FIG. 2b, the heat treatment temperature is a little higher than that of embodiment 1 to enhance bonding strength in order to prevent delamination during a subsequent dicing process. During the dicing step (FIG. 2c), the piezoelectric composite substrate 1, 2 is cut into 3×3 mm pieces by a dicing saw. A second heat treatment is then applied at a temperature of 350° C. for 3 hours to form bonding interface 22. FIG. 2d shows the piezoelectric composite substrates after the second heat treatment.

In the present embodiment, since the joined piezoelectric composite substrate 1, 2 is cut into small pieces after the first heat treatment to reduce bonding area per piece, water structuring molecules and gases remaining at the bonding interface 21 are easily removed during the second heat treatment. Accordingly, thermal stress unevenly generated during the second heat treatment is further reduced compared to the manufacturing method of the first embodiment.

The above-described method is very effective when substrates 1, 2 are large because water remaining at a central portion of the substrates 1, 2 can be thoroughly removed.

The manufacturing method illustrated above can suppress generation of voids, reduce stress, and realize wafer bonding using only heat treatments. That is, the step of thinning the substrate is avoided, thus, resulting in improved manufacturing yield of piezoelectric composite substrates, especially, when the substrate 1, 2 size is large.

The first heat treatment can be divided into a low temperature step and a high temperature step, as in embodiment 1.

In the above embodiment, single crystal piezoelectric material such as lithium tantalate or lithium niobate or other mirror grindable piezoelectric materials can be used as the piezoelectric substrate. Semiconductor substrates such as of gallium arsenide, indium phosphate, glass, or other piezoelectric substrates having different thermal expansion coefficients from that of the piezoelectric substrate 1 can be used as the substrate 2 to be bonded with the piezoelectric substrate 1.

Embodiment 3

A third embodiment of the manufacturing method of the present invention will be illustrated referring to FIG. 3. As shown in FIG. 3a, the substrate materials 1, 2 and configurations are the same as in embodiment 1. Similar to embodiment 2, the processes through the abutting process are performed. Then, a first heat treatment is applied at 250° C. for 5 hours. Next as shown in FIG. 3c, a part of silicon substrate 2 is removed from the surface opposite of the bonding interface 21 by etching in a hydrofluoric acid system. Then a second heat treatment is applied at a temperature of 350° C. for 3 hours.

During the first heat treatment of the present embodiment, water and gases are easily removed from the bonding interface 21, and the piezoelectric composite substrate 1, 2 is temporarily bonded for the etching process of silicon substrate 2. Since the bonding area of the piezoelectric composite substrate is reduced, water structuring molecules and gas are easily removed from the bonding interface 21.

The manufacturing method illustrated above can suppress generation of voids, reduce stress, and realize wafer bonding, thus resulting in improved manufacturing yield of piezoelectric composite substrates, especially, when the joined substrates 1, 2 are large.

The first heat treatment can be divided into a low temperature step and a high temperature step, as in embodiment 1.

In the above embodiment, single crystal piezoelectric material such as lithium tantalate or lithium niobate or other mirror grindable piezoelectric materials can be used as the piezoelectric substrate 1. Semiconductor substrates such as gallium arsenide, indium phosphate, glass, or other piezoelectric substrates having different thermal expansion coefficients from that of the piezoelectric substrate 1 can be used as the substrate 2 to be bonded with the piezoelectric substrate 1.

Embodiment 4

A fourth embodiment of the manufacturing method of the present invention will next be explained with reference again to FIG. 1. In the present embodiment, substrate 2 is glass and is used instead of silicon. To simplify the explanation, an example using a glass substrate in only the case of embodiment 1 is illustrated here. However, when a glass substrate 2 is used in the case of embodiments 2 or 3, the same effect as shown in embodiments 2 and 3, namely reducing stress at the central portion of the substrate, can be obtained.

In the present embodiment, the following advantage can be obtained by using a glass substrate 2. A thermal expansion coefficient of a glass substrate can be changed by adding an alkali component such as sodium hydroxide. By bringing the thermal expansion coefficient of the glass close to that of quartz, the second heat treatment temperature can be increased and the piezoelectric composite substrate 1, 2 can be strongly bonded and manufactured with a high yield. Also, glass material is inexpensive. Therefore, the manufacturing cost of piezoelectric composite substrates can be reduced.

In the present embodiment, quartz substrate 1 is 12×12 mm in size, and 80 $\mu$m thick. The glass substrate 2 is 12×12 mm in size, and 400 $\mu$m thick. The thermal expansion coefficient of the glass substrate 2 is $14 \times 10^{-6}/°C$.

The manufacturing method of the fourth embodiment is as follows. First, the surfaces of the glass substrate 2 and the quartz substrate 1 are mirror ground and their respective surface layers are removed by a hydrofluoric acid system etching solution. Next, the glass substrate 2 and the quartz substrate 1 are dipped into a mixed solution of ammonia, hydrogen peroxide, and deionized water to make the principal surfaces thereof hydrophilic. Thereafter, substrates 1, 2 are washed by deionized water. As a result of the hydrophilic treatment, the surfaces of the substrates 1, 2 are terminated with hydroxyl groups. Next, mirror ground surfaces of the two substrates are abutted, and the two are adhered to each other by Van der Waals force.

Next, a first heat treatment is applied under the same conditions as embodiment 1.

Next, a second heat treatment is applied at a temperature of 300° C. for 3 hours. This second heat treatment removes water at the bonding interface 21 and bonds the substrates 1, 2 along a bonding interface 22 by ionic bonds or covalent bonds. The second heat treatment is applied at a higher temperature than that of the first heat treatment.

The piezoelectric composite substrate 1, 2 after the first heat treatment, is joined at the bonding interface 21 mainly by hydroxyl groups or water structuring molecules as discussed earlier. These bonds are relatively weak and therefore, water and gases at the bonding interface 21 of substrates 1, 2 can be more easily removed. Accordingly, few voids form at the bonding interface 22 of the substrates 1, 2 after the second heat treatment. As a result, the two substrates 1, 2 are strongly bonded at an atomic level at bonding interface 22 mainly by covalent bonds (siloxane bonds).

The first heat treatment can be divided into a low temperature step and high a temperature step, as in embodiment 1.

In the above embodiment, single crystal piezoelectric material such as lithium tantalate or lithium niobate or other mirror grindable piezoelectric materials can be used as the piezoelectric substrate 1.

Embodiment 5

A fifth embodiment of the manufacturing method of the present invention will be explained again with reference to FIG. 1. Substrates used here are a lithium niobate substrate 1 and a silicon substrate 2. To simplify the explanation, an example using a lithium niobate substrate in only the case of embodiment 1 is illustrated here. However, when a lithium niobate substrate 1 is used in the case of embodiment 2 or 3, the same effect as shown in embodiments 2 or 3, namely reducing stress at the central portion of the substrate, can be obtained.

In the present embodiment, the silicon substrate 2 is, for example, 12×12 mm in size and 450 $\mu$m thick, and lithium niobate substrate 1 is, for example, 12×12 mm in size and 80 $\mu$m thick.

Similar to embodiment 1, the processes through the abutting process of the two substrates 1, 2 are performed. Then, a first heat treatment is applied at a temperature of 250° C. for 5 hours. The first heat treatment is generally applied at a temperature of 100–300° C. for several minutes to tens of hours, and preferably at 100–200° C. for at least one hour. Under these conditions bonding of the substrates 1, 2 does not occur.

A second heat treatment is applied at a temperature of 350° C. for 3 hours. In the case of the lithium niobate substrate 1 and silicon substrate 2, the second heat treatment is generally applied at 200–1000° C. for several minutes to tens of hours, and preferably at a temperature of 250–400° C. The latter temperature range is desirable because, bonding of silicon and lithium niobate starts at 250° C., and the substrates 1, 2 may be damaged at temperature higher than 400° C.

Piezoelectric material is very easily broken depending on its component materials and cut angle, so it may be damaged by uneven thermal stress even during the weak bonding stage. However, in the case of quartz, the phase transition temperature is considerably higher than its damage temperature, and therefore, it is not necessary to determine a maximum temperature of the second heat treatment with regard to the phase transition temperature.

Since the first heat treatment temperature is low, the two substrates 1, 2 are bonded weakly. Water and other gases are easily removed from the bonding interface 21. Thus, few voids form at the bonding interface 21 of the substrates 1, 2 and there is little variation of bonding speed at the surface.

As a result, the substrates 1, 2 are not damaged from stress concentration. After the second thermal heat treatment, the piezoelectric composite substrate is strongly bonded at the atomic level at the bonding interface 22.

The first heat treatment can be divided into a low temperature step and a high temperature step, as in embodiment 1.

Embodiment 6

A sixth embodiment of the manufacturing method of the present invention will be illustrated again with reference to FIG. 1. In this embodiment substrate 1 is quartz and substrate 2 is silicon. For simplicity of illustration, the same method as in embodiment 1 is illustrated. However, when the present embodiment is applied to the methods of embodiments 2 or 3, the same effect as shown in those embodiments, namely reducing stress at the central portion of the substrate, can be obtained.

In the present embodiment, the quartz substrate 1 is, for example, 10×10 mm in size and 56 $\mu$m thick, and the silicon substrate 2 is, for example, 10×10 mm in size and 450 $\mu$m thick.

First, the quartz substrate 1 and silicon substrate 2 are mirror ground and etched by an etching solution of a hydrofluoric acid system etching solution to remove their respective surface layers. Next, the quartz substrate 1 and the silicon substrate 2 are dipped into a mixed solution of ammonia, hydrogen peroxide, and deionized water to make the principal surfaces thereof hydrophilic. Thereafter the substrates 1, 2 are washed thoroughly with deionized water.

As a result of the hydrophilic treatment, the surface of each substrate is terminated by hydroxyl groups. Next, the mirror ground surfaces of the two substrates 1, 2 are abutted, and are then adhered to one another by Van der Waals force.

Next, a first heat treatment is applied at a temperature of 150° C., for 5 hours to remove excess water remaining on or within the substrates 1, 2. The first heat treatment is generally applied at a temperature in a range between 100–300° C., for several minutes to tens of hours, and preferably in a temperature range between 100–200° C. for one hour to tens of hours. While some heating is necessary to remove excess water, ionic bonding or covalent bonding should be avoided since, stress will be experienced at the interface 21 and this may cause damage to the substrates 1, 2. In other words, the first heat treatment temperature should be a temperature at which the adhesive force by Van der Waals force is maintained, ionic bonding or covalent bonding does not occur, but water can nevertheless be removed. More specifically, the two substrates after the first heat treatment, should be separable from mechanical my a mechanical means.

Next, a second heat treatment is applied at a temperature of 250° C., for 3 hours. Here, as illustrated in embodiment 1 in the case of quartz, the temperature of the first heat treatment should be under the $\alpha$-$\beta$ phase transition temperature, namely 573° C. However, phase transition can occur at a temperature lower than 573° C. when stress caused by bonding is experienced by the substrates 1, 2. Accordingly, the temperature is reduced by 50° C. compared to the case of embodiment 1 in order to prevent the aforementioned phase transition problem.

In this embodiment after the first heat treatment the two substrates 1, 2 are adhered to one another mainly by hydrogen bonds, and crystal structure transition, due to phase transition of the quartz substrate 1, is not experienced.

Water molecules and gas are easily removed from the bonding interface 21 during the first heat treatment, and water structuring molecules and gas spread uniformly in the interface 21. Thus, uneven thermal stress applied to the quartz substrate 1 is largely decreased. Accordingly, there is neither stress concentration nor phase transition of the quartz substrate 1.

As a result of the first heat treatment, thermal stresses in the bonding interface 21 are generated nearly uniformly during the second heat treatment such that phase transition of the quartz substrate 1 does not occur.

The manufacturing method of wafer bonding illustrated above can suppress the generation of voids during the heat treatments and thereby reduce stress, using only heat treatments. That is, the step of thinning the substrate is avoided, resulting in improved manufacturing yield of piezoelectric composite substrates. Also, phase transition of the piezoelectric substrate can be prevented and a piezoelectric composite substrate of desired characteristics can be manufactured.

The first heat treatment can be divided into a low temperature step and a high temperature step, as in embodiment 1.

In the above embodiment, single crystal piezoelectric materials such as lithium tantalate or lithium niobate or other mirror grindable piezoelectric materials can be used as the piezoelectric substrate 1. Semiconductor substrates such as of gallium arsenide, indium phosphate, glass, or other piezoelectric material having a different thermal expansion coefficients from that of the piezoelectric substrate 1 can be used as substrate 2 to be bonded with the piezoelectric substrate 1.

Embodiment 7

A seventh embodiment of the manufacturing method of the present invention will next be explained, again with reference to FIG. 1. In the present embodiment, substrate 1 is quartz and a substrate 2 is glass. For simplicity of explanation, only the method of embodiment 1 is illustrated. However, by using the method of embodiments 2 or 3 with the present embodiment, the same effect as shown in those embodiments, namely reducing stress at a central portion of the substrates 1, 2 can be obtained.

In the present embodiment, glass is used instead of silicon for substrate 2. The thermal expansion coefficient of glass can be changed by varying its component materials. Thus a thermal expansion coefficient close to that of a piezoelectric material to which the glass will be bonded can be selected. Accordingly, piezoelectric composite substrates with strong bonds can be manufactured with good yield rates. Moreover, glass is inexpensive. Thus, when used as a supporting substrate, manufacturing costs are reduced. The quartz substrate 1 is 12×12 mm in size, and 80 $\mu$m thick, and the glass substrate 2 is 12×12 mm in size, 400 $\mu$m thick. The thermal expansion coefficient of the glass substrate 2 is $10 \times 10^{-6}$/°C.

After mirror grinding, washing, and hydrophilic treatment, the substrates 1, 2 are abutted. The first heat treatment is applied at a temperature of 150° C. for 5 hours and is generally applied at a temperature range from 90–350° C. and preferably 150–300° C.

Then, the second heat treatment is applied at a temperature of 250° C. for 3 hours. As discussed in embodiment 1 in the case of a quartz substrate 1, the second heat treatment temperature can be, theoretically, up to 573° C., the phase transition temperature of quartz. However, when the stress caused by bonding is experienced by the substrate, the phase transition occurs at a temperature lower than 573° C. Accordingly, the second heat treatment temperature of the present embodiment is 50° C. lower than that of embodiment 1 in order to avoid the aforementioned phase transition problem. The second heat treatment is generally applied, therefore, in a temperature range from 100–573° C., and preferably 250–573° C.

When using a glass substrate 2 which has the advantage of an adjustable thermal expansion rate, the manufacturing method illustrated above can realize wafer bonding, while suppressing the generation of voids and reducing stress, using only heat treatments. That is, the step of thinning the substrate is avoided, resulting in improved manufacturing yields of piezoelectric composite substrates. Also the phase transition of piezoelectric composite substrates can be prevented, and piezoelectric composite substrates with particular performance characteristics can be manufactured. Single crystal piezoelectric materials such as lithium tantalate or lithium niobate or other mirror grindable piezoelectric materials can also be used as the piezoelectric substrate 1.

Embodiment 8

FIG. 4 shows an eighth embodiment of the manufacturing method of the present invention. In FIG. 4a, substrate 1 is quartz, and substrate 2 is silicon. Here, an integrated circuit for signal processing can be formed on the silicon substrate 2. Since wafer bonding can be applied by low temperature heat treatments, the heat treatments do not damage the characteristics of the integrated circuit.

Figure 4A:
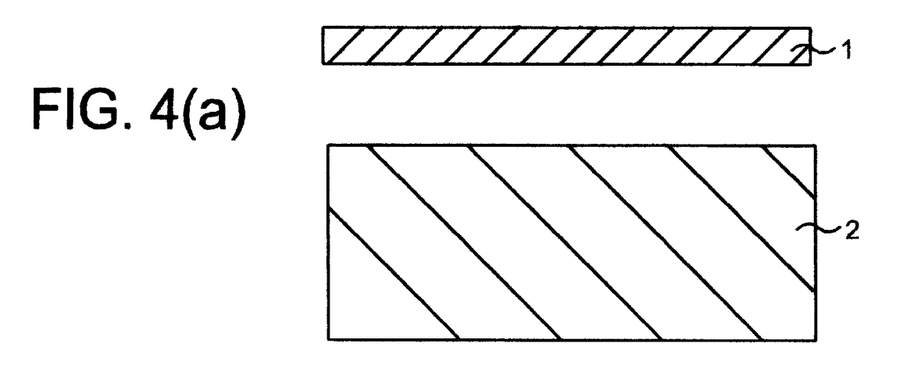
FIGS. 4a–d show a manufacturing method of a piezoelectric composite substrate in accordance with a fourth embodiment of the present invention.
Figure 4B:
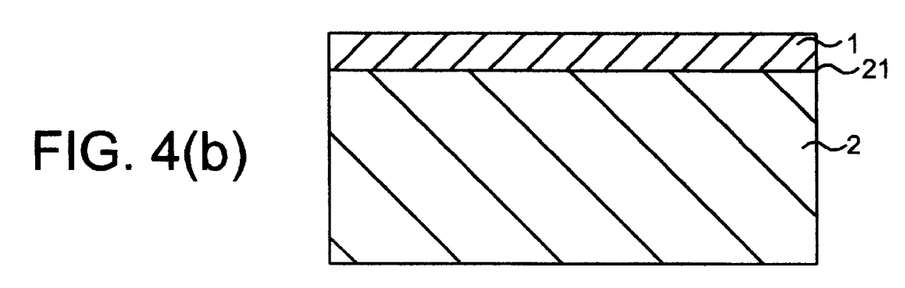
Figure 4C:
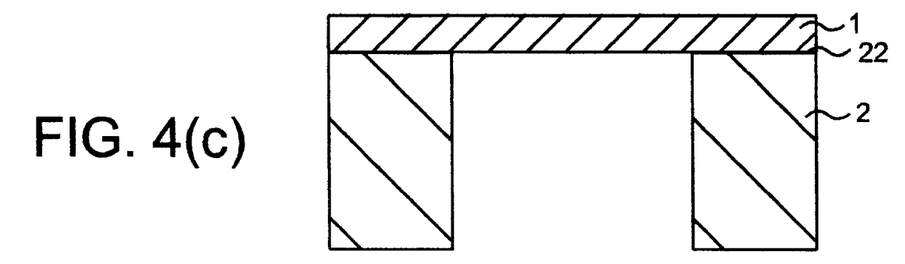

After mirror grinding, washing, and hydrophilic treatment of the substrates 1, 2 similar to the method described in embodiment 1, the substrates 1, 2 are abutted. A first heat treatment is applied at a temperature of 180° C. for 5 hours (FIG. 4b). The first heat treatment is generally applied at a temperature range from 100–300° C., and preferably 100–200° C. at which temperatures substrate bonding does not occur. Then, as shown in FIG. 4c, part of the silicon substrate 2 is removed by an etching solution of hydrofluoric acid system. Incidentally, in actual piezoelectric elements, a part of the substrate where a transducer of piezoelectric device is formed must be removed.

Next, a second heat treatment is applied at a temperature of 380° C. for 3 hours, which results in the structure shown in FIG. 4c. In the case of a quartz substrate 2 and a silicon substrate 1, the second heat treatment is applied at a higher temperature than that of the first heat treatment, but under 573° C. for a period ranging from several minutes to several hours. Preferably the temperature range is 200–500° C.

In the first heat treatment of the present embodiment, temporary bonding of the piezoelectric composite substrate is desired in order to accomplish the etching process of the silicon substrate 2. The second heat treatment is applied to strongly bond the silicon substrate 2 and quartz substrate 1. The portion 5 in FIG. 4d of quartz substrate 1 is strongly bonded at the atomic level.

Figure 4D:
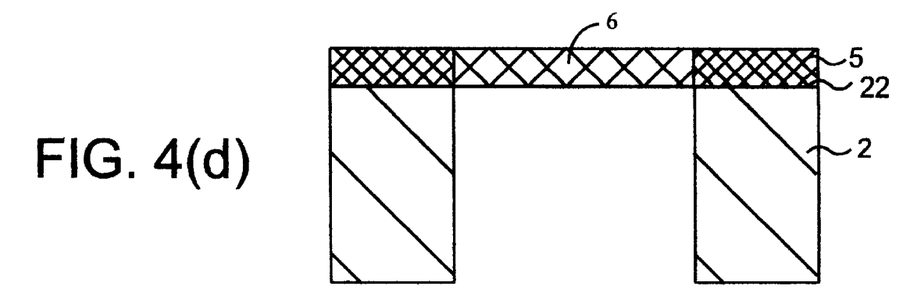

Here, a portion 5 of quartz substrate 1 at the bonding area and in the vicinity of the bonding area is phase transformed, while a portion 6 of quartz substrate 1, in the area where silicon substrate 2 was removed, is not phase transformed. That is, by the manufacturing method of the present embodiment, even if phase transition occurs at the bonding area in the second heat treatment, the unbonded portion 6 of the substrate used to form a transducer of a piezoelectric device is free from phase transitions. In other words, the second heat treatment can be applied without regard to the phase transition temperature. As a result, devices with desired characteristics can be manufactured using the portion 6 of quartz substrate 1, because that portion is without phase transition. Accordingly, piezoelectric devices can be manufactured with good yields. The manufacturing method illustrated above can realize wafer bonding while suppressing the generation of voids and reducing stress, and result in improved manufacturing yields of piezoelectric composite substrates. Also, the phase transition at a portion affecting the characteristics of piezoelectric device of the composite substrate can be prevented.

Like all other embodiments, the first heat treatment can be divided into a low temperature step and a high temperature step.

Single crystal piezoelectric materials such as lithium tantalate or lithium niobate or other mirror grindable piezoelectric materials can be used as the piezoelectric substrate 1 in the present embodiment. Semiconductor substrates such as gallium arsenide, indium phosphate, glass, or other piezoelectric substrates having a different thermal expansion coefficients from that of the piezoelectric substrate 1 can also be used as the substrate 2.

Embodiment 9

Figure 5A:
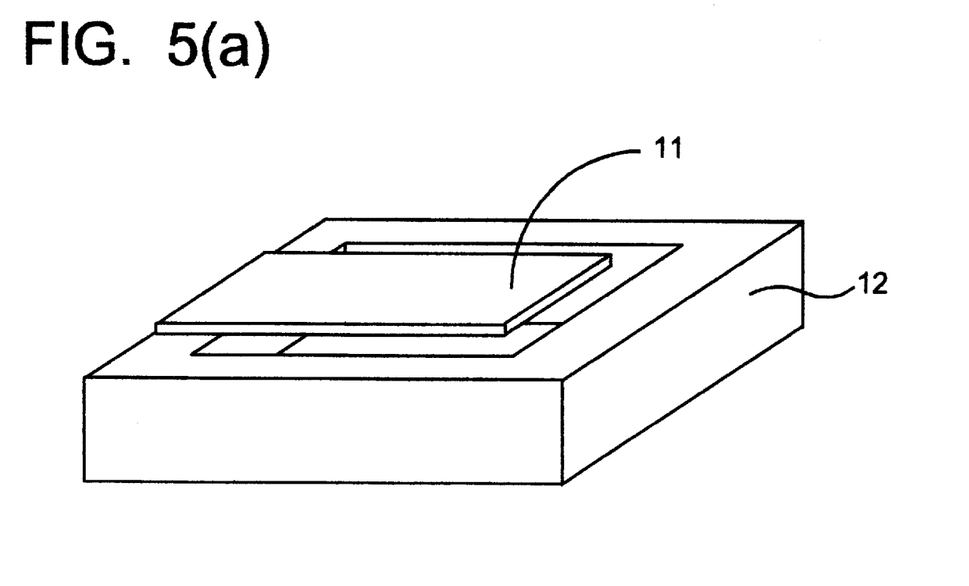
FIGS. 5a–b show structural views of a piezoelectric composite substrate of a ninth through a twelfth embodiment of the present invention, where
Figure 5B:
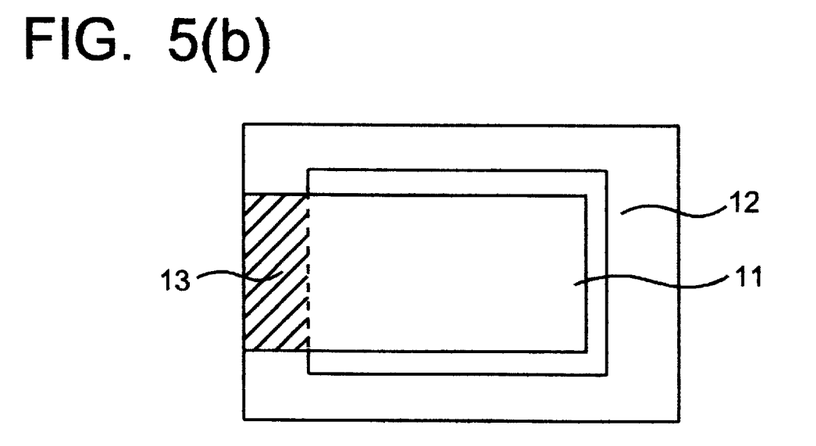

FIGS. 5a and 5b show, respectively, a perspective view and a top view of a piezoelectric device using a piezoelectric composite substrate of the present invention. In this embodiment, and those discussed hereinafter, a composite substrate used for a piezoelectric device will be illustrated.

In FIG. 5, a piezoelectric substrate 11 is, for example, an AT cut quartz substrate 4×8 mm in size and 50 μm thick. Semiconductor substrate 12 is, for example, a silicon substrate 8×12 mm in size and 450 μm thick. A bonding area 13 of the piezoelectric substrate 11 and the semiconductor substrate 12 is 4×1 mm in size. An integrated circuit for signal processing may be formed on the silicon substrate 12. Since wafer bonding can be achieved at a low temperature, the heat treatment does not affect the performance characteristics of the integrated circuit. In the present embodiment, bonding area 13 has a rectangular shape with its shorter side aligned with the x axis direction of the AT cut quartz substrate and its longer side aligned with a z' axis, which slants 35° 22' from the z axis of the quartz substrate.

Figure 6A:
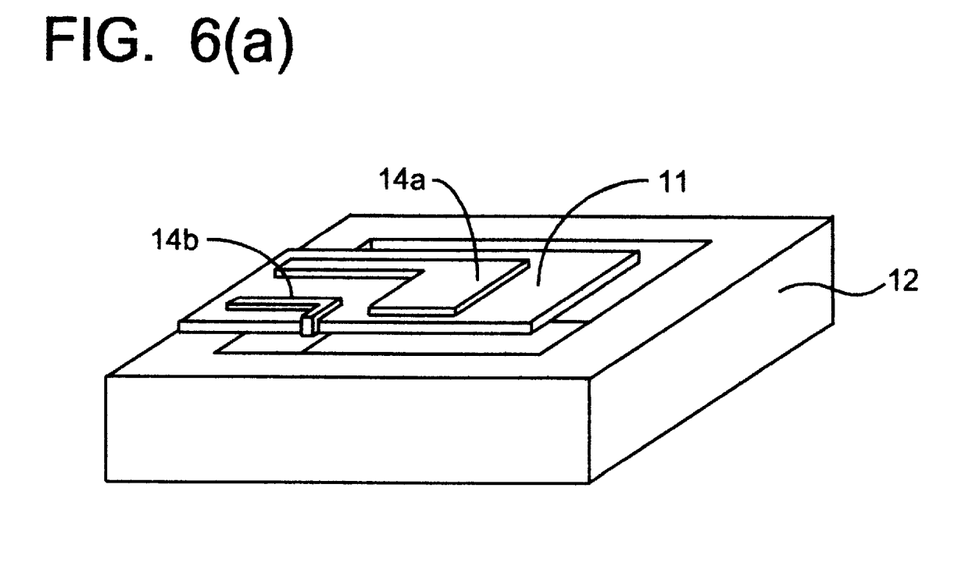
FIGS. 6a–b show structural views of a piezoelectric oscillator using the piezoelectric composite substrate in accordance with a ninth through a twelfth embodiment of the present invention, where
Figure 6B:
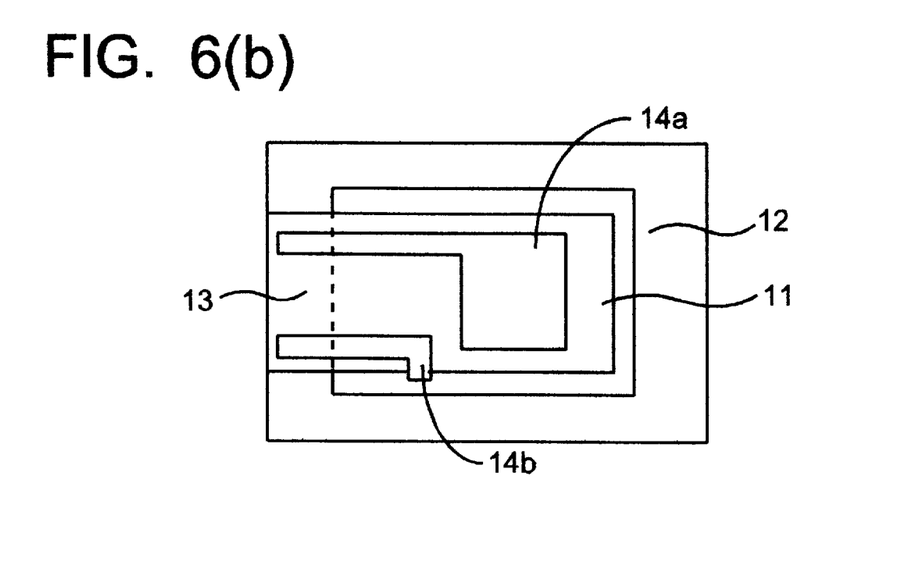

With reference to FIG. 6, excitation electrodes 14a, 14b are provided on upper and lower surfaces of piezoelectric substrate 11 to form a piezoelectric oscillator.

A manufacturing method of a quartz crystal oscillator, one application of the piezoelectric composite substrate of the present embodiment, will next be discussed.

Surfaces of an AT cut quartz substrate 11 and silicon substrate 12 are mirror ground and washed. Also during this step, the AT cut quartz substrate 11 is thinned to a predetermined thickness, for example 50 μm.

Silicon substrate 12 is bore-etched by a hydrofluoric acid system etching solution to form the configuration corresponding to semiconductor substrate 12 in FIG. 6.

Excitation electrodes corresponding to 14a, 14b, in FIG. 6 are formed on the upper and lower surfaces of the AT cut quartz substrate 11 by means of photolithography, vacuum evaporation, or equivalent method. Rear side electrode 14b extends to the upper side of the AT cut quartz substrate 11 by being routed around the edge of the AT cut quartz substrate 11.

The substrates 11, 12 are dipped in a mixed solution of ammonia, hydrogen peroxide, and deionized water to make the principal surfaces thereof hydrophilic, and are thereafter washed with deionized water. As a result of the above treatments, water structuring molecules stick to each substrate surface.

The mirror ground surfaces of the two substrates are abutted and are adhered by Van der Waals force created by the water structuring molecules.

The substrates 11, 12 are temporarily bonded by a first heat treatment at a temperature of 150° C. for 5 hours, and then further heat treated at 350° C. for 2 hours. In the case of an AT cut quartz substrate 11 and silicon substrate 12, a second heat treatment is generally applied at a temperature of 100–573° C. for several minutes to tens of hours. Preferably, the temperature is in the range of 250–500° C.

One of the features of the piezoelectric oscillator of the present invention is that the rectangular configuration of the bonding area 13 associated with the piezoelectric substrate 11 is such that the thermal expansion coefficient in the direction of the longer side of the rectangle is close to that of the semiconductor substrate 12. The thermal expansion coefficients of the AT cut quartz substrate 11 are $15.2 \times 10^{-6}/°C$. in the x axis direction and $11 \times 10^{-6}/°C$. in the z' direction described above. Thus, the longer side of the rectangle is arranged to be along the Z' axis direction.

The following observations were made with regard to the quartz oscillator structure described above. The variation of the resonance frequency at a temperature range between 0 and 60° C. was 10 ppm or less. No damage to, or delamination of, the substrates 11, 12 occurred as a result of a heat shock test from room temperature to 260° C. Phase transition of the quartz substrate was observed at the bonding area 13 between the quartz substrate 11 and the silicon substrate 12, while, it was not observed at other areas of the quartz substrate 11. Presence of the phase transition can be confirmed by observing the surface state after etching by a hydrofluoric acid system solution. It can also be confirmed by measuring the face spacing of the crystal lattice by using X ray diffraction. In the structure above, quartz substrate 11 is hardly affected by the thermal stress caused by the different thermal expansion coefficients of the substrates. Therefore, piezoelectric oscillations are not hampered by the thermal stress. Since phase transition does not occur in the quartz substrate portion which constitutes a piezoelectric oscillator, the same frequency to temperature stability as the AT cut quartz itself can be obtained. Also, since the substrates 11, 12 are securely bonded by wafer bonding, the substrates 11, 12 are not damaged if subjected to a heat shock such as solder reflowing.

The same effect can be observed if the corners of the rectangle are curved. Even with other configurations of the substrate 11 in the bonding area 13, the same effect can be expected by orienting the piezoelectric substrate 11 in a direction such that the thermal expansion coefficients of the piezoelectric substrate is closer to that of the semiconductor substrate.

Also by bonding the piezoelectric substrate 11 at both ends, the strength against shock can be enhanced.

Again, the first heat treatment can be divided into a low temperature step and high temperature step, as in the other embodiments.

Single crystal piezoelectric materials such as lithium tantalate or lithium niobate or other mirror grindable piezoelectric materials can be used as the piezoelectric substrate 11 in the present embodiment. Semiconductor substrates such as gallium arsenide, indium phosphate, glass, or other piezoelectric substrates having different thermal expansion coefficients from that of the piezoelectric substrate 11 can also be used as the substrate 12.

Embodiment 10

Figure 7A:
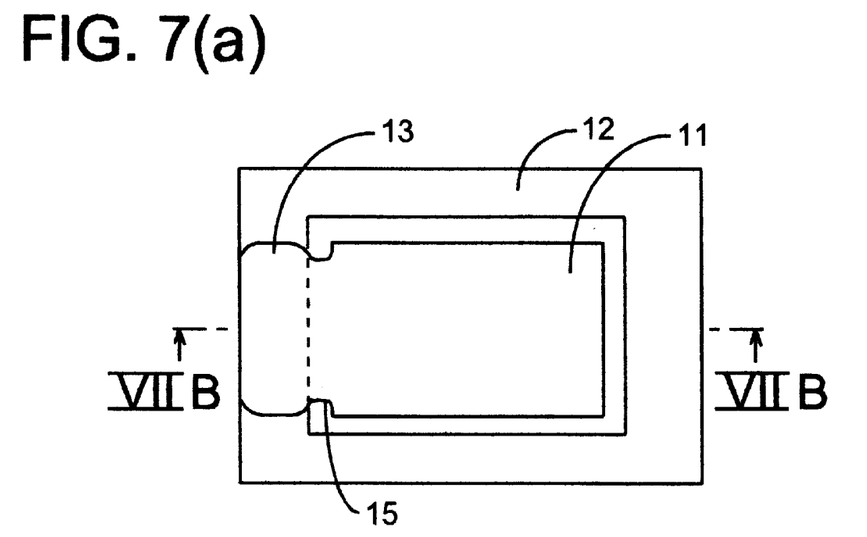
Figure 7B:
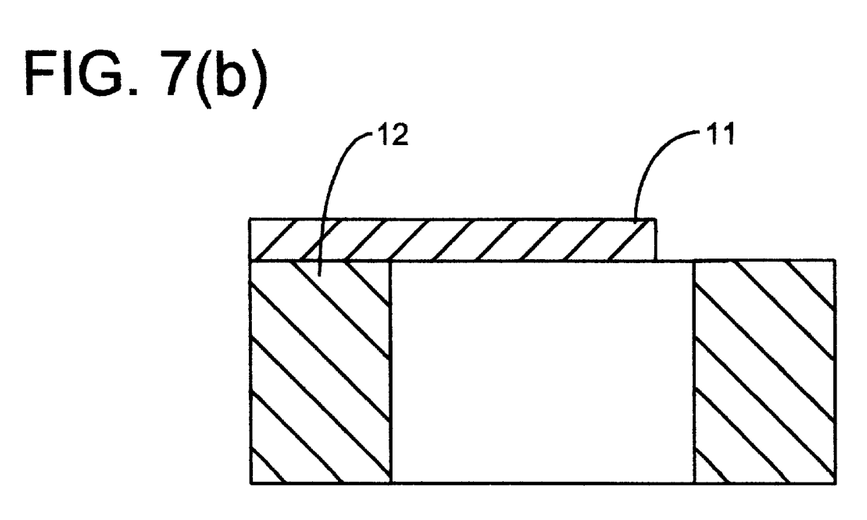

FIGS. 7a and 7b show, respectively, a top structural view and a sectional structural view of a tenth embodiment of the present invention. In FIG. 7, substrate 11 is a piezoelectric substrate, and in this embodiment is an AT cut quartz 4×8 mm in size and 50 μm thick. Substrate 12 is a semiconductor substrate, which in this case is a silicon substrate 8×12 mm in size and 450 μm thick. Here, an integrated circuit for signal processing may be formed on the silicon substrate 12.

Since wafer bonding can be achieved at a low temperature, the heat treatment does not affect the performance characteristics of the integrated circuit.

The piezoelectric substrate 11 and the semiconductor substrate 12 are bonded at a bonding area 13 which is 4×1 mm in size. Bonding area 13 is of a substantial rectangular shape with curved corners. Its shorter side is aligned with the quartz x axis direction and its longer side is aligned with a z' axis which slants 35° 22' from the actual quartz z axis. A constricted part 15 is formed just beyond the bonding area 13 in order to reduce stress.

Figure 8A:
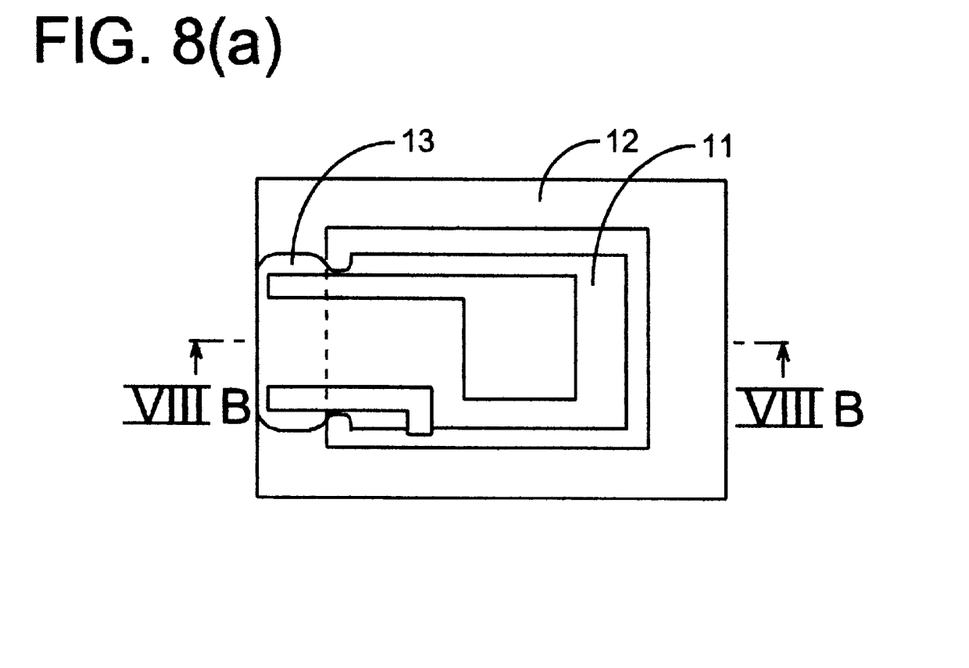
FIGS. 8a–b show structural views of a piezoelectric oscillator using the piezoelectric composite substrate in accordance with a modification of the tenth embodiment of the present invention, where
Figure 8B:
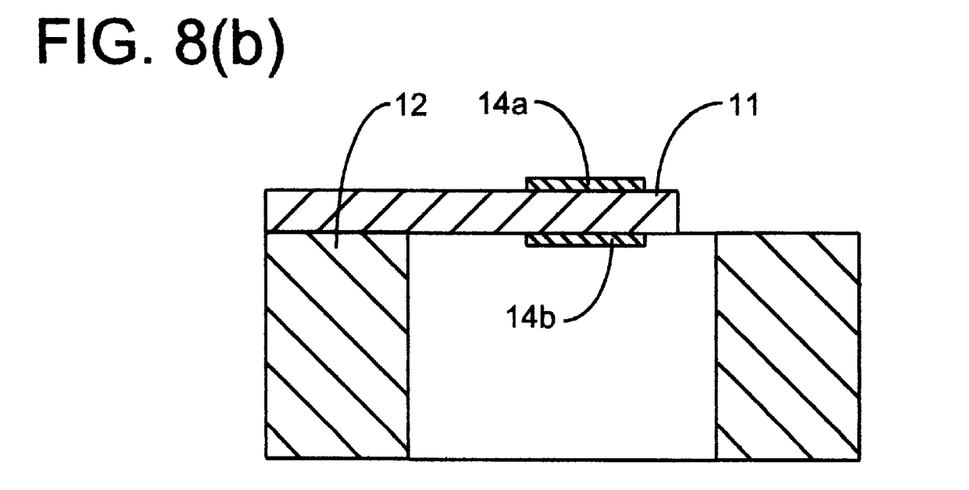

Also in the present embodiment, excitation electrodes 14a, 14b, are provided on upper and lower surfaces of quartz substrate 11 to form a piezoelectric oscillator as shown in FIG. 8. A quartz oscillator having the above described configuration is advantageous in that the constricted part 15 effectively reduces damage to the quartz caused by thermal stress and the effects to the oscillator due to thermal stress or subsequent stress.

Moreover, in the above structure, quartz substrate 11 is barely affected by thermal stress caused by the different thermal expansion coefficients and as a result, piezoelectric oscillation is not hampered by thermal stress. Since phase transition does not occur beyond the bonding area 13, the same resonant frequency to temperature stability of the AT cut quartz can be obtained in the piezoelectric oscillator. Also, since the substrates 11, 12 are securely bonded by wafer bonding, the substrates 11, 12 are not damaged if subjected to heat shock from solder reflowing, for example.

In the present embodiment, while AT cut quartz was used as a piezoelectric substrate 11, other cut angle quartz substrates can be used in accordance with the application. For instance, lithium niobate or lithium tantalate can be used. These materials have lower frequency-to-temperature change stability, but have higher electromechanical connection coefficients as compared with quartz.

Embodiment 11

An eleventh embodiment of a piezoelectric oscillator in accordance with the present invention is illustrated next with reference again to FIGS. 5 and 6. Substrate 11 in this embodiment is X cut lithium tantalate instead of AT cut quartz and is 4×8 mm in size and 50 μm thick, for example. The shorter side of the bonding area 13 rectangle is aligned with the x axis direction of the x-cut lithium tantalate substrate 11 and its longer side is aligned with the z axis direction of substrate 11.

The difference between the present embodiment and embodiment 9 is that lithium tantalate is used as the piezoelectric substrate 11. Lithium tantalate has a lower frequency-to-temperature change stability, but has a higher electromechanical connection coefficient and lower Q value compared to quartz. Accordingly, lithium tantalate is widely used in voltage controlled oscillators requiring high efficiency and a relatively wide frequency range. Lithium niobate can be used to obtain similar results.

With the structure above, the lithium tantalate substrate 11 is minimally affected by thermal stress caused by the difference in thermal expansion coefficients compared with silicon substrate 12. Thus, piezoelectric oscillations are not hampered by thermal stress. Also since phase transition does not occur beyond the bonding area 13 in the piezoelectric oscillator, the same resonant frequency-to-temperature stability of the lithium tantalate can be obtained. Moreover, since the substrates 11, 12 are securely bonded by wafer bonding, the substrates 11, 12 are not damaged if subjected to heat shock from solder reflowing, for example.

The same effect as described above can be obtained by making the rectangle corners curved. Even with other configurations of the supporting portion, the same effect can be expected by orienting the piezoelectric substrate in a direction such that thermal expansion coefficients of the piezoelectric substrate 11 are closer to that of semiconductor substrate 12.

Also by bonding the piezoelectric substrate 11 at both ends, the strength against shock can be enhanced.

Embodiment 12

A twelfth embodiment of a piezoelectric oscillator in accordance with the present invention is illustrated next again with reference to FIGS. 5 and 6. In this embodiment substrate 11 is an X cut lithium tantalate instead of AT cut quartz, and substrate 12 is glass instead of silicon as in the embodiment 9. X cut lithium tantalate substrate 11 is 4×8 mm in size and 50 μm thick, for example, and the glass substrate 12 is 8×12 mm in size, and 400 μm thick. The glass thermal expansion coefficient is $10 \times 10^{-6}/°C$. The shorter side of the rectangle of the bonding area 13 is aligned in the x axis direction of the substrate 11 and the longer side is aligned with the z axis direction of the substrate 11.

The difference between the present embodiment and embodiment 11 is that glass is used instead of silicon for the substrate 12. The thermal expansion coefficient of glass can be altered such that its thermal expansion coefficient is close to that of a piezoelectric material to which it is bonded. Also, glass is inexpensive, thereby reducing manufacturing costs.

In the structure described above, the lithium tantalate substrate 11 is minimally affected by thermal stress caused by the difference in thermal expansion coefficients between itself and glass substrate 12. Thus, piezoelectric oscillations are not hampered by thermal stress. Also, since phase transition does not occur beyond the bonding area 13 in the piezoelectric oscillator, the same resonant frequency-to-temperature stability of the lithium tantalate can be obtained. Moreover, since the substrates 11, 12 are securely bonded by wafer bonding, the substrates 11, 12 are not damaged if subjected to heat shock from solder reflowing, for example.

The same effect as described above can be obtained by making the rectangle corners curved. Even with other configurations of the bonding area 13, the same effect can be expected by orienting the piezoelectric substrate in a direction such that the thermal expansion coefficients of piezoelectric substrate are closer to that of semiconductor substrate 12.

Also, by bonding the piezoelectric substrate 11 at both ends, the strength against shock can be enhanced.

What is claimed is:

1. A piezoelectric device comprising:
   a piezoelectric substrate composed of piezoelectric material and including excitation electrodes on a portion thereof; and
   a supporting substrate bonded by one of covalent bonding and ionic bonding to a bonding portion provided on a part of said piezoelectric substrate,
   wherein the crystal structure of the piezoelectric substrate at the portion having the excitation electrodes is different from the crystal structure of the piezoelectric substrate at the bonding portion.

2. The piezoelectric device of claim 1, wherein said piezoelectric substrate is a quartz substrate.

3. The piezoelectric device of claim 1, wherein the bonding portion has a substantially rectangular shape having a length and a width and wherein the width is aligned with a longer axis of said piezoelectric substrate, the length is aligned with a shorter axis of said piezoelectric substrate and the width is shorter than the length.

4. The piezoelectric device of claim 1, wherein said supporting substrate is a silicon substrate including an integrated circuit.

5. The piezoelectric device of claim 1, wherein said supporting substrate comprises one of semiconductor material and glass material.

6. A piezoelectric device comprising:
   a piezoelectric substrate composed of piezoelectric material and including electrodes on a portion thereof; and
   a supporting substrate bonded by one of covalent bonding and ionic bonding to a bonding portion provided on a part of said piezoelectric substrate,
   wherein the bonding portion is of a substantial rectangular shape;
   a thermal expansion coefficient of said piezoelectric substrate in the direction of a longer side of the rectangular shape is different from a thermal expansion coefficient of said piezoelectric substrate in the direction of a shorter side of the rectangular shape; and
   the difference between the thermal expansion coefficient of said piezoelectric substrate in the longer side direction of the rectangular shape and the thermal expansion coefficient of said supporting substrate is less than the difference between the thermal expansion coefficient of said piezoelectric substrate in the shorter side direction of the rectangular shape and the thermal expansion coefficient of said supporting substrate.

7. The piezoelectric device of claim 6, wherein said piezoelectric substrate is a quartz substrate.

8. The piezoelectric device of claim 6, wherein the bonding portion has substantially rectangular shape having a length and a width and wherein the width is aligned with a longer axis of said piezoelectric substrate, the length is aligned with a shorter axis of said piezoelectric substrate and the width is shorter than the length.

9. The piezoelectric device of claim 6, wherein said supporting substrate is a silicon substrate including an integrated circuit.

10. The piezoelectric device of claim 6, wherein said supporting substrate comprises one of semiconductor material and glass material.

* * * * *